(12) United States Patent
Takahashi et al.

(10) Patent No.: US 9,215,447 B2
(45) Date of Patent: Dec. 15, 2015

(54) IMAGING DEVICE AND IMAGING APPARATUS INCLUDING A PIXEL WITH LIGHT RECEIVING REGION ON ONE SIDE OF A CENTER OF THE PIXEL

(71) Applicant: FUJIFILM Corporation, Tokyo (JP)

(72) Inventors: Shu Takahashi, Saitama (JP); Kazufumi Sugawara, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/229,078

(22) Filed: Mar. 28, 2014

(65) Prior Publication Data

US 2014/0210954 A1  Jul. 31, 2014

Related U.S. Application Data

(63) Continuation of application No. PCT/JP2012/072735, filed on Sep. 6, 2012.

(30) Foreign Application Priority Data

Sep. 29, 2011  (JP) .................................. 2011-215640

(51) Int. Cl.
*H04N 13/02* (2006.01)
*H01L 27/146* (2006.01)
(Continued)

(52) U.S. Cl.
CPC ...... *H04N 13/0217* (2013.01); *H01L 27/14621* (2013.01); *H01L 27/14625* (2013.01); *H01L 27/14645* (2013.01); *H04N 5/23212* (2013.01); *H04N 5/3696* (2013.01); *H04N 13/0257* (2013.01); *G02B 7/34* (2013.01); *H04N 2101/00* (2013.01)

(58) Field of Classification Search
None
See application file for complete search history.

(56) References Cited

U.S. PATENT DOCUMENTS

2007/0126885 A1\*  6/2007  Hasegawa .................. 348/222.1
2010/0328485 A1\*  12/2010  Imamura et al. ........... 348/222.1
(Continued)

FOREIGN PATENT DOCUMENTS

| JP | 2003-7994 A | 1/2003 |
| JP | 2008-17116 A | 1/2008 |
| JP | 2011-44820 A | 3/2011 |
| JP | 2011-103335 A | 5/2011 |

OTHER PUBLICATIONS

International Preliminary Report on Patentability, dated Apr. 16, 2013, for International Application No. PCT/JP2012/072735 (Form PCT/IPEA/409) with an English translation.
(Continued)

*Primary Examiner* — Joseph Ustaris
*Assistant Examiner* — Kevin McInnish
(74) *Attorney, Agent, or Firm* — Birch, Stewart, Kolasch & Birch, LLP

(57) ABSTRACT

Provided is an imaging device which can accurately obtain two captured image signals having a phase difference therebetween. An imaging device includes a plurality of pixels including two types of pixels, such as a first pixel that receives one of a pair of light beams which pass through different pupil regions of an imaging optical system and a second pixel that receives the other of the pair of light beams. The plurality of pixels are arranged in a square lattice shape. A light receiving region of the first pixel deviates from the center of the first pixel to the right side. A light receiving region of the second pixel deviates from the center of the second pixel to the left side.

1 Claim, 11 Drawing Sheets

(51) Int. Cl.
  *H04N 5/232* (2006.01)
  *H04N 5/369* (2011.01)
  *G02B 7/34* (2006.01)
  *H04N 101/00* (2006.01)

(56) References Cited

U.S. PATENT DOCUMENTS

2011/0109776 A1* 5/2011 Kawai .......................... 348/273
2012/0193515 A1* 8/2012 Agranov et al. ........... 250/208.1

OTHER PUBLICATIONS

International Search Report, dated Oct. 9, 2012, for International Application No. PCT/JP2012/072735 (Form PCT/ISA/210) with an English translation.

Written Opinion of the International Searching Authority, dated Sep. 27, 2012, for International Application No. PCT/JP2012/072735 (Form PCT/ISA/237).

Extended European Search Report Dated Jun. 22, 2015 received in corresponding EP Application No. 12836605.1.

* cited by examiner

IMAGING DEVICE AND IMAGING APPARATUS INCLUDING A PIXEL WITH LIGHT RECEIVING REGION ON ONE SIDE OF A CENTER OF THE PIXEL

CROSS REFERENCE TO RELATED APPLICATIONS

This application is a Bypass Continuation of PCT International Application No. PCT/JP2012/072735 filed on Sep. 6, 2012, which claims priority under 35 U.S.C §119(a) to Patent Application No. 2011-215640 filed in Japan on Sep. 29, 2011, all of which are hereby expressly incorporated by reference into the present application.

BACKGROUND OF THE INVENTION

1. Field of the Invention

The present invention relates to an imaging device and an imaging apparatus.

2. Description of the Related Art

An imaging apparatus has been known which receives light that has been emitted from an object and then passed through an imaging optical system, using an imaging device in which micro lenses and pixels, which are photoelectric conversion units, are two-dimensionally arranged, generates an image using a captured image signal of the imaging device, and detects the focus-adjusted state of the imaging optical system (for example, see JP2003-007994A).

SUMMARY OF THE INVENTION

FIG. 11 is a schematic plan view illustrating the imaging device disclosed in JP2003-007994A. The imaging device shown in FIG. 11 includes a pixel A in which a light receiving region a deviates from the center of the pixel to the right side and a pixel B in which a light receiving region b deviates from the center of the pixel to the left side. In the imaging device, since the deviation direction of the light receiving region a in the pixel is opposite to the deviation direction of the light receiving region b in the pixel in a row direction X, it is possible to acquire phase difference information in the row direction X.

When attention is paid to the pixel A and the pixel B which are surrounded by a frame W in FIG. 11, light is incident on the light receiving region b of the pixel B in a direction represented by a white thick arrow in FIG. 11 and light which travels in a direction opposite to the direction in which light is incident on the light receiving region b of the pixel B is incident on the light receiving region a of the pixel A. The light receiving region b of the pixel B is adjacent to the right side of the light receiving region a of the pixel A in the frame W. Therefore, so-called crosstalk occurs in which a portion (a white thin arrow in FIG. 11) of the light which is incident on the light receiving region a of the pixel A leaks to the light receiving region b of the adjacent pixel, or a portion (a white thin arrow in FIG. 11) of the light which is incident on the light receiving region b of the pixel B leaks to the light receiving region a of the adjacent pixel. The direction of an optical component caused by the crosstalk is opposite to the incident direction of light which is detected in each of the pixels A and B. Therefore, when the crosstalk occurs, the detected signals are offset by a crosstalk component in the pixels A and B, which makes it difficult to accurately obtain two captured image signals having a phase difference therebetween. In addition, color mixture occurs.

In recent years, the imaging device has been miniaturized and crosstalk is likely to occur. Therefore, it is important to accurately obtain two captured image signals having a phase difference therebetween.

The invention has been made in view of the above-mentioned problems and an object of the invention is to provide an imaging device which can accurately obtain two captured image signals having a phase difference therebetween and an imaging apparatus including the imaging device.

An imaging device according to the invention includes a plurality of pixels including two types of pixels, such as a first pixel that receives one of a pair of light beams which pass through different pupil regions of an imaging optical system and a second pixel that receives the other of the pair of light beams. The plurality of pixels are two-dimensionally arranged. A light receiving region of the first pixel deviates from a center of the first pixel in one direction. A light receiving region of the second pixel deviates from a center of the second pixel in a direction opposite to the one direction. When each pixel to which three or four pixels are adjacent is a pixel of interest, among the three or four pixels adjacent to the pixel of interest, pixels which are close to the pixel of interest in a deviation direction of the light receiving region in the pixel of interest include at least a pixel which is the same type as the pixel of interest. The "pixels adjacent to the pixel of interest" mean four pixels with the centers closest to the center of the pixel of interest.

An imaging apparatus according to the invention includes an imaging device, a single imaging optical system, and a three-dimensional image data generation unit that generates three-dimensional image data, using image data based on a captured image signal which is output from a first pixel of the imaging device and image data based on a captured image signal which is output from a second pixel of the imaging device.

According to the invention, it is possible to provide an imaging device which can accurately obtain two captured image signals having a phase difference therebetween and an imaging apparatus including the imaging device.

DESCRIPTION OF THE PREFERRED EMBODIMENTS

Hereinafter, an embodiment of the invention will be described with reference to the drawings.

Figure 1:
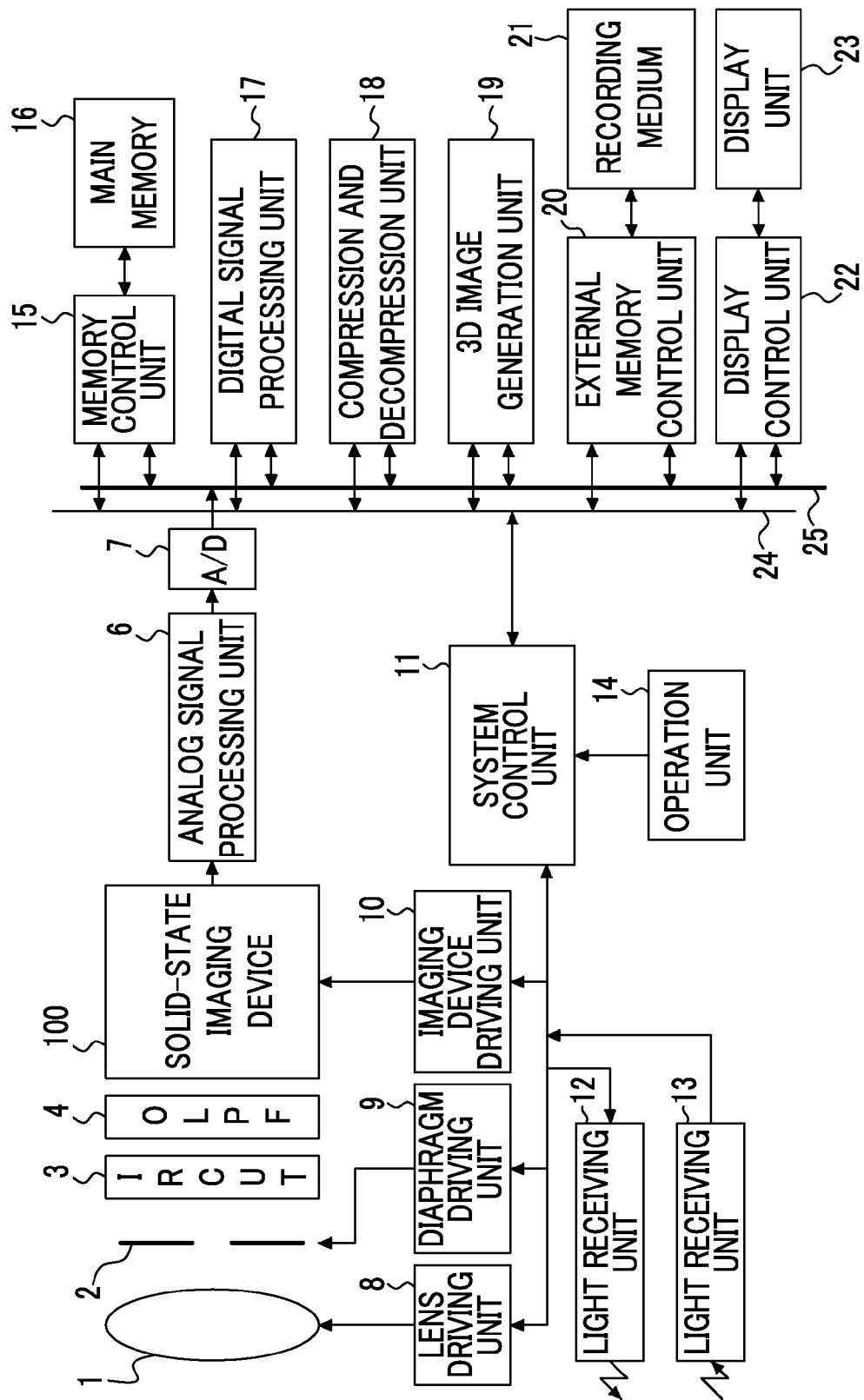
FIG. 1 is a diagram illustrating the schematic structure of an imaging apparatus according to an embodiment of the invention.

FIG. 1 is a diagram illustrating the schematic structure of an imaging apparatus according to an embodiment of the invention. Examples of the imaging apparatus include imaging apparatuses, such as a digital camera and a digital video camera, and imaging modules which are provided in an electronic endoscope and a portable phone with a camera. In this embodiment, a digital camera is given as an example of the imaging apparatus.

An imaging system of the digital camera which is shown in the drawings includes a single imaging optical system 1 including a focus lens and a zoom lens, an imaging device 100, such as a CCD image sensor or a CMOS image sensor, and a diaphragm 2, an infrared cut filter 3, and an optical low-pass filter 4 which are provided between the single imaging optical system 1 and the imaging device 100.

A system control unit 11 which controls the overall operation of the entire electric control system of the digital camera controls a flash emitting unit 12 and a light receiving unit 13. In addition, the system control unit 11 controls a lens driving unit 8 such that the position of a focus lens included in the imaging optical system 1 is adjusted or the position of a zoom lens included in the imaging optical system is adjusted. The system control unit 11 controls the aperture of the diaphragm 2 through a diaphragm driving unit 9 such that the amount of exposure is adjusted.

The system control unit 11 drives the imaging device 100 through an imaging device driving unit 10 to output an object image captured by the imaging optical system 1 as a captured image signal. The user inputs an instruction signal to the system control unit 11 through an operation unit 14.

The electric control system of the digital camera further includes an analog signal processing unit 6 which is connected to the output of the imaging device 100 and performs analog signal processing, such as correlated double sampling, and an A/D conversion circuit 7 which converts RGB color signals output from the analog signal processing unit 6 into digital signals. The analog signal processing unit 6 and the A/D conversion circuit 7 are controlled by the system control unit 11.

The electric control system of the digital camera further includes a main memory 16, a memory control unit 15 connected to the main memory 16, a digital signal processing unit 17 which performs, for example, an interpolation operation, a gamma correction operation, and an RGB/YC conversion process to generate captured image data, a compression and decompression processing unit 18 which compresses the captured image data generated by the digital signal processing unit 17 in a JPEG format or decompresses the compressed image data, a three-dimensional image generation unit 19 which generates three-dimensional image data using a plurality of captured image data items captured by the imaging device 100, an external memory control unit 20 which is connected to a detachable recording medium 21, and a display control unit 22 which is connected to a liquid crystal display unit 23 provided on, for example, the rear surface of the camera. The memory control unit 15, the digital signal processing unit 17, the compression and decompression processing unit 18, the three-dimensional image generation unit 19, the external memory control unit 20, and the display control unit 22 are connected to each other by a control bus 24 and a data bus 25 and are controlled by instructions from the system control unit 11. The liquid crystal display unit 23 displays two captured image data items having parallax therebetween such that they can be three-dimensionally viewed.

Figure 2:
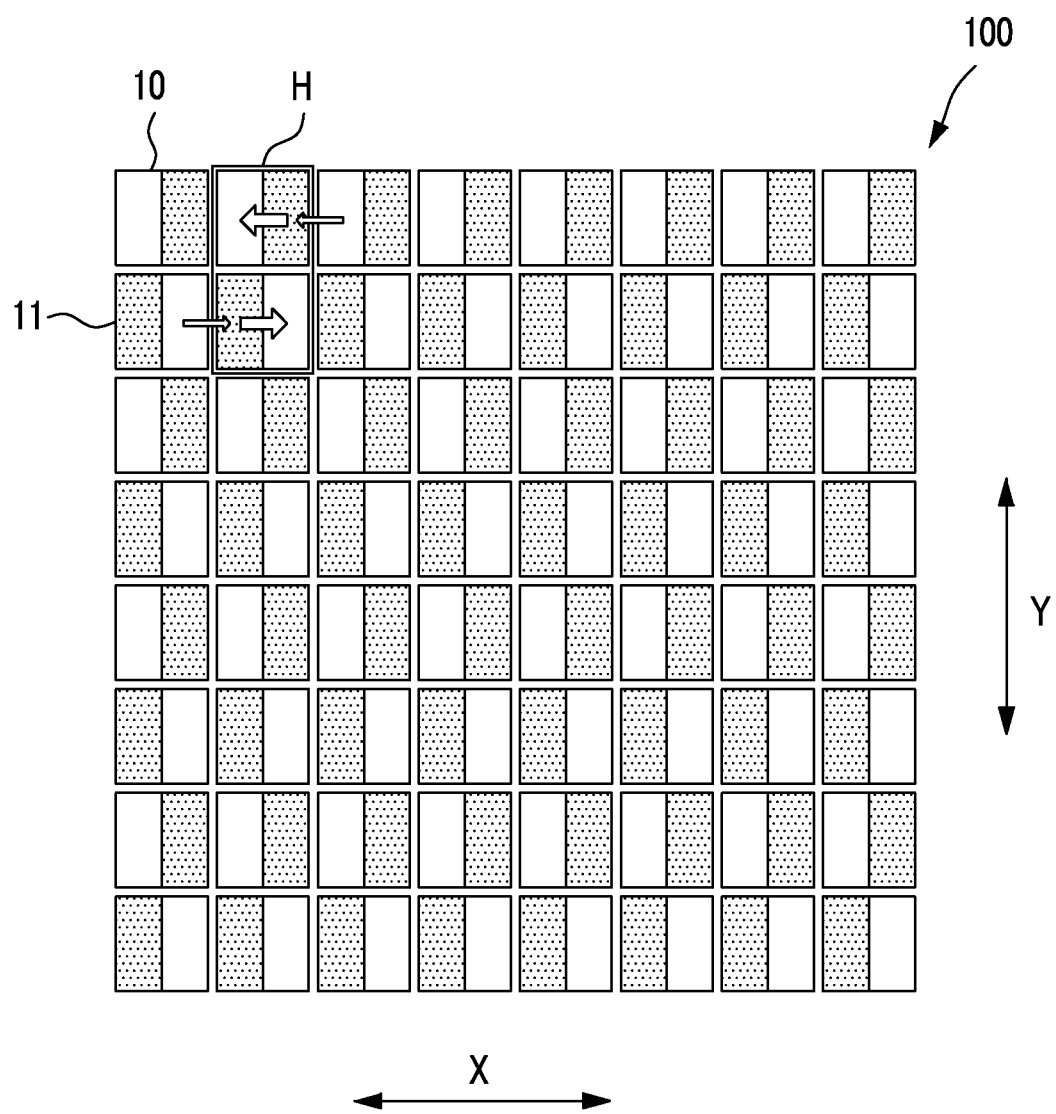
FIG. 2 is a schematic plan view illustrating the schematic structure of an imaging device 100 shown in FIG. 1.

FIG. 2 is a schematic plan view illustrating the schematic structure of the imaging device 100 shown in FIG. 1.

The imaging device 100 includes a plurality of pixels which are two-dimensionally arranged in a row direction X and a column direction Y perpendicular to the row direction X. The plurality of pixels include two types of pixels, that is, pixels 10 which detect one of a pair of light beams passing through different pupil regions of the imaging optical system 1 and pixels 11 which detect the other of the pair of light beams. The number of pixels of one of the two types is equal to the number of pixels of the other type. The imaging device 100 is not provided with a pixel which can detect both of the pair of light beams passing through different pupil regions of the imaging optical system 1.

In the example shown in FIG. 2, in the pixel 10, a light receiving region (a white rectangular portion in FIG. 2) which receives light and converts the light into an electric signal deviates from the center of the pixel 10 to the left direction. A region (hatched region) of the pixel 10 other than the light receiving region is shielded by a light shielding film.

In the pixel 11, a light receiving region (a write rectangular portion in FIG. 2) which receives light and converts the light into an electric signal deviates from the center of the pixel 11 to the right direction opposite to the deviation direction (left direction) of the light receiving region in the pixel 10. A region (hatched region) of the pixel 11 other than the light receiving region is shielded by the light shielding film.

For example, the pixels 10 and 11 are formed by the deviation between the center of the pixel and the center of an opening which is formed in the light shielding film provided on a semiconductor substrate having a photodiode formed thereon. In addition, the pixels 10 and 11 may be configured that the center of the pixel deviates from the central position of the photodiode provided in the semiconductor substrate (the photodiode is formed only in the right half or left half of the pixel). The pixels 10 and 11 may have any known structure, but the structure of the pixels 10 and 11 is not limited to those described in the specification.

In the arrangement of the pixels shown in FIG. 2, rows of a plurality of pixels 10 arranged in the row direction X, and rows of a plurality of pixels 11 arranged in the row direction X are alternately arranged in the column direction Y. That is, among the rows of the pixels in the imaging device 100, the pixels 10 are arranged in the odd-numbered rows and the pixels 11 are arranged in the even-numbered rows. In addition, the pixels 11 may be arranged in the odd-numbered rows and the pixels 10 may be arranged in the even-numbered rows.

In the imaging device 100 having the above-mentioned structure, when attention is paid to each pixel 10, among pixels adjacent to each pixel 10, a pixel which is close to each pixel 10 in the deviation direction (on the left side in FIG. 2) of the light receiving region in each pixel 10 is the same type as the pixel 10. The term "adjacent pixels" means four pixels with the closest distance between the centers thereof For example, pixels are arranged around the pixel 10 which is disposed at the upper left corner of FIG. 2, that is, pixels are arranged on the right side and the lower right side of the pixel 10 and below the pixel 10. Among the three pixels, the right pixel and the lower pixel are pixels adjacent to the pixel 10 which is disposed at the upper left corner of FIG. 2.

When attention is paid to each pixel 11, among pixels adjacent to each pixel 11, a pixel which is close to each pixel 11 in the deviation direction (on the right side in FIG. 2) of the light receiving region in each pixel 11 is the same type as the pixel 11.

When attention is paid to the pixel 10 and the pixel 11 in a frame H shown in FIG. 2, oblique light (represented by a white thick arrow) which travels from the right to the left in FIG. 2 is incident on the light receiving region of the pixel 10. In addition, oblique light (represented by a white thick arrow) which travels from the left to the right in FIG. 2 is incident on the light receiving region of the pixel 11 in the frame H.

Similarly to the pixel 10 in the frame H, oblique light which travels from the right to the left in FIG. 2 is incident on the light receiving region of another pixel 10 which is adjacent to the right side of the pixel 10 in the frame H and a portion of the oblique light (represented by a white thin arrow in FIG. 2) leaks to the pixel 10 in the frame H. Since the leakage light is incident on the light shielding region of the pixel 10 in the frame H, little leakage light reaches the light receiving region of the pixel 10 in the frame H. Even when the light reaches the light receiving region of the pixel 10 in the frame H, phase difference information is not offset by the leakage light since the direction of the leakage light is aligned with the direction of light which is detected in the light receiving region of the pixel 10 in the frame H. Therefore, it is possible to prevent a reduction in the accuracy of a signal obtained from the pixel 10 in the frame H.

Similarly to the pixel 11 in the frame H, oblique light which travels from the left to the right in FIG. 2 is incident on the light receiving region of another pixel 11 which is adjacent to the left side of the pixel 11 in the frame H and a portion of the oblique light (represented by a white thin arrow in FIG. 2) leaks to the pixel 11 in the frame H. Since the leakage light is incident on the light shielding region of the pixel 11 in the frame H, little leakage light reaches the light receiving region of the pixel 11 in the frame H. Even when the light reaches the light receiving region of the pixel 11 in the frame H, phase difference information is not offset by the leakage light since the direction of the leakage light is aligned with the direction of light which is detected in the light receiving region of the pixel 11 in the frame H. Therefore, it is possible to prevent a reduction in the accuracy of a signal obtained from the pixel 11 in the frame H.

In the digital camera shown in FIG. 1, the digital signal processing unit 17 processes the captured image signal, which is a set of signals output from each pixel 10 of the imaging device 100, to generate image data for the right eye and processes a captured image signal, which is a set of signals output from each pixel 11 of the imaging device 100, to generate image data for the left eye. Then, the three-dimensional image generation unit 19 generates three-dimensional image data in a format which can be three-dimensionally reproduced, from the image data for the right eye and the image data for the left eye which are generated by the digital signal processing unit 17, and records the three-dimensional image data on the recording medium 21. The system control unit 11 displays a three-dimensional image based on the three-dimensional image data on the display unit 23.

As described above, when the imaging device 100 is used, the image data for the right eye and the image data for the left eye have accurate parallax therebetween. Therefore, it is possible to improve the quality of the three-dimensional image data generated by the image data for the right eye and the image data for the left eye.

In the digital camera shown in FIG. 1, the system control unit 11 may calculate the phase difference information using the captured image signal, which is a set of the signals output from each pixel 10 of the imaging device 100, and the captured image signal, which is a set of the signals output from each pixel 11 of the imaging device 100, and control a phase difference AF for driving the focus lens in the imaging optical system 1 on the basis of the phase difference information. The use of the imaging device 100 makes it possible to prevent a reduction in the accuracy of the phase difference AF.

In the imaging device 100, when each pixel to which three or four pixels are adjacent is a pixel of interest, the layout of the pixels 10 and 11 of the imaging device 100 may be determined so as to satisfy the conditions that, among the three or four pixels adjacent to the pixel of interest, a pixel which is close to the pixel of interest in the deviation direction of the light receiving region in the pixel of interest is the same type as the pixel of interest. In this case, it is possible to obtain the above-mentioned effect. For pixels (pixels arranged at four corners in FIG. 2) to which three or four pixels are not adjacent, each pixel to which three or four pixels are adjacent may be laid out under the conditions and the layout may be appropriately determined such that the conditions are not broken.

For example, the pixel 10 which is arranged at the upper right corner of FIG. 2 can be replaced with the pixel 11. In addition, the pixel 11 which is arranged at the lower left corner of FIG. 2 can be replaced with the pixel 10.

Figure 3:
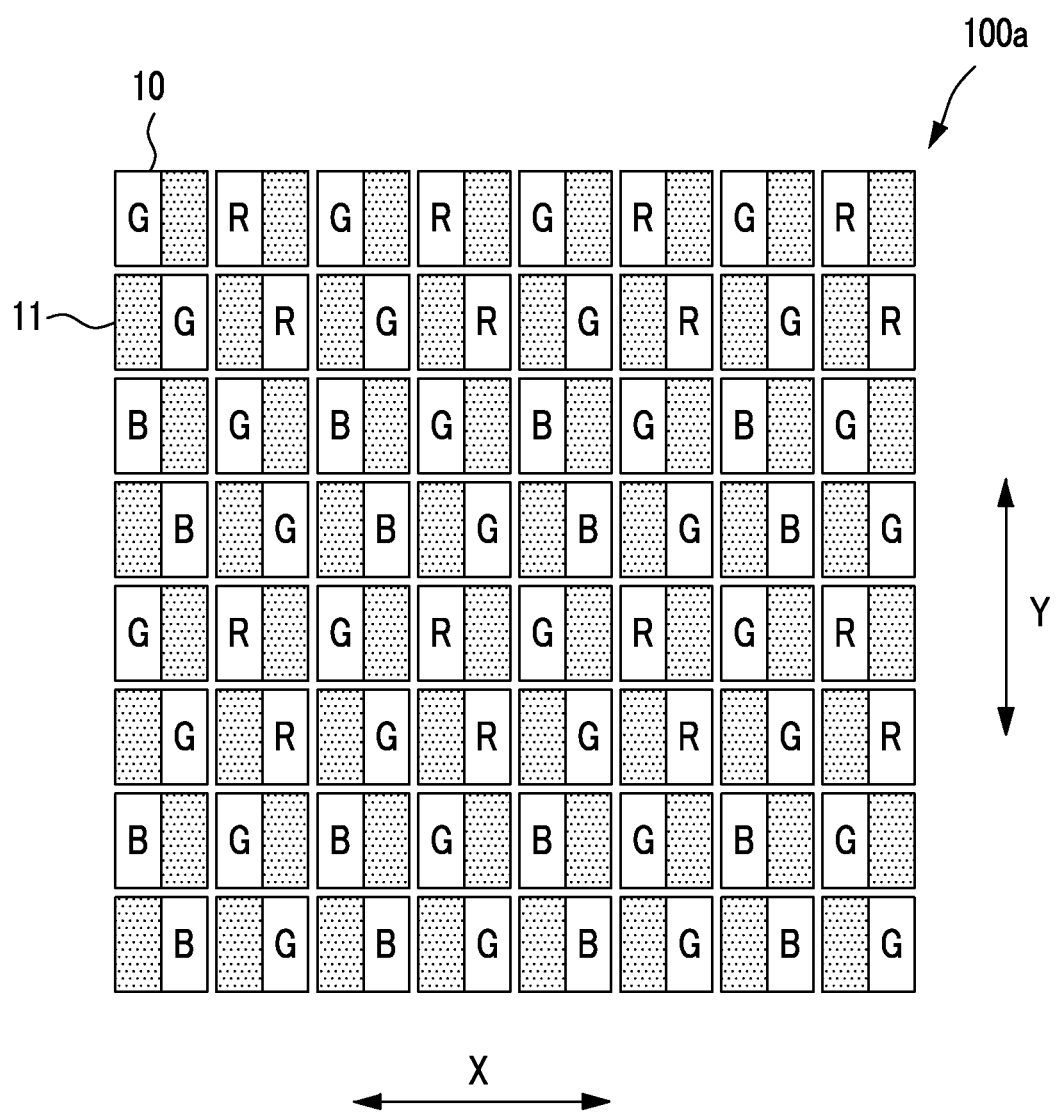
FIG. 3 is a schematic plan view illustrating an imaging device 100a which is a modification example of the imaging device 100 provided in a digital camera shown in FIG. 1.

FIG. 3 is a schematic plan view illustrating an imaging device 100a which is a modification example of the imaging device 100 provided in the digital camera shown in FIG. 1.

The imaging device 100a has the same structure as the imaging device 100 except that any one of three types of color filters is provided in a light receiving region of each pixel. In addition, a complementary color filter or a white color filter other than the three types of color filters may be used.

In FIG. 3, a letter "R" is assigned to a light receiving region of a pixel on which a color filter that transmits red light is provided. A letter "G" is given to a light receiving region of a pixel on which a color filter that transmits green light is provided. A letter "B" is given to a light receiving region of a pixel on which a color filter that transmits blue light is provided.

As shown in FIG. 3, the arrangement of the color filters provided on the pixels 10 of the imaging device 100a is the Bayer array and the arrangement of the color filters provided on the pixels 11 of the imaging device 100a is also the Bayer array.

When the pixel 10 and the pixel 11 which are adjacent to each other in the column direction Y and detect light of the same color form a pair, pairs of pixels which detect red light, pairs of pixels which detect green light, and pairs of pixels which detect blue light are entirely arranged in the Bayer array.

When the imaging device 100a is used instead of the imaging device 100, it is possible to use the image data for the right eye and the image data for the left eye as color image data and to capture a three-dimensional color image. When a color image captured, there is a concern that color mixture caused by crosstalk will have an effect on image quality. According to the structure of the imaging device 100a, since color mixture caused by crosstalk is prevented in each pixel, it is possible to prevent deterioration of image quality.

In addition, a captured image signal, which is a set of signals output from each pixel 10 of the imaging device 100, and a captured image signal, which is a set of signals output from each pixel 11 of the imaging device 100, are the same as those obtained from a general imaging device with the Bayer array. Therefore, the digital camera can simply generate three-dimensional image data, using signal processing for the general imaging device with the Bayer array.

Figure 4:
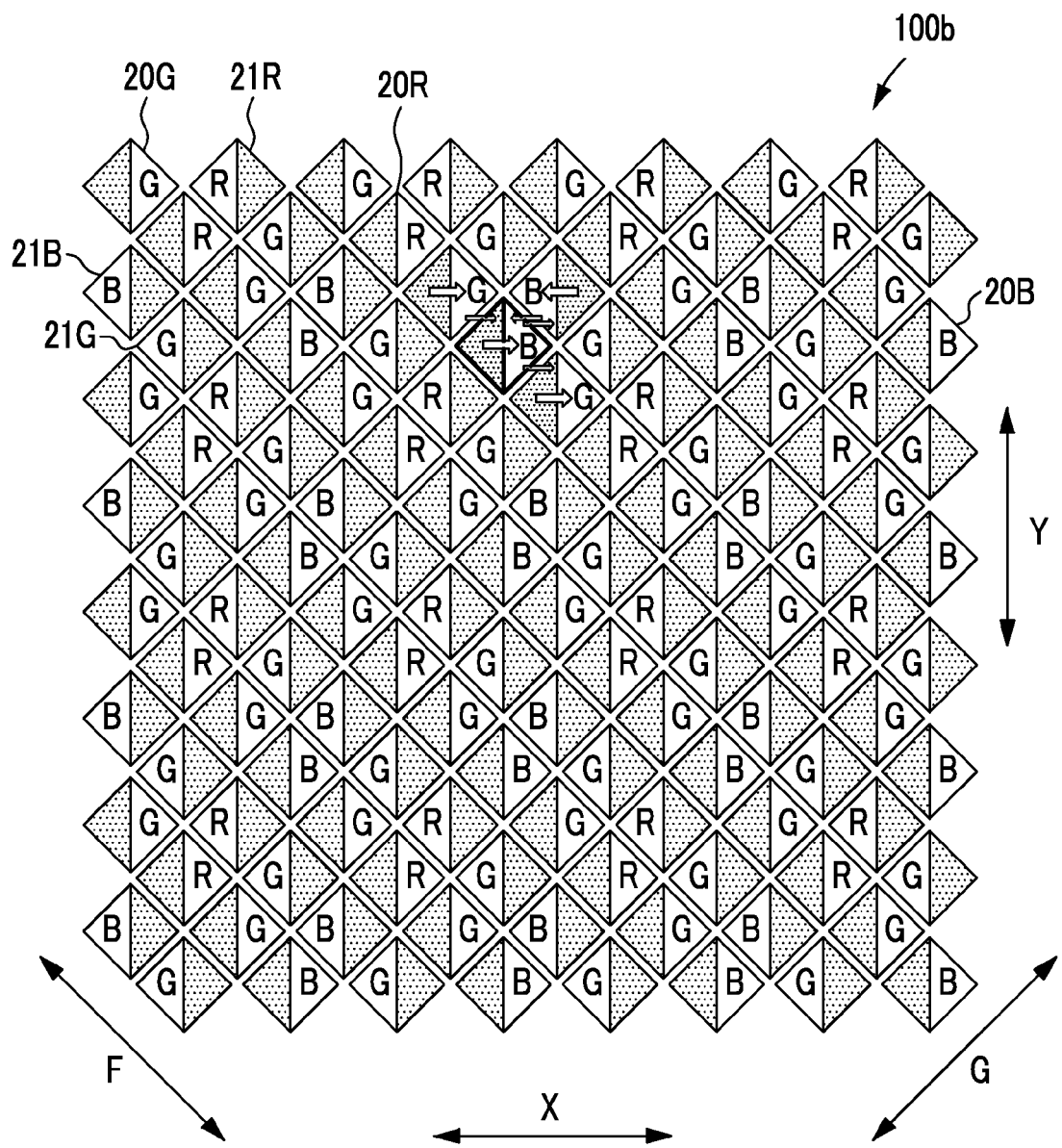
FIG. 4 is a schematic plan view illustrating an imaging device 100b which is a modification example of the imaging device 100 provided in the digital camera shown in FIG. 1.

FIG. 4 is a schematic plan view illustrating an imaging device 100b which is a modification example of the imaging device 100 provided in the digital camera shown in FIG. 1.

The imaging device 100b includes a plurality of pixels (a rectangular block including a hatched triangle and a triangle which is not hatched in FIG. 4) which are two-dimensionally arranged in the row direction X and the column direction Y perpendicular to the row direction X. In the arrangement of the plurality of pixels, a plurality of pixel rows, each having a plurality of pixels arranged in the row direction X, are arranged in the column direction Y and an odd-numbered row among the plurality of pixel rows is shifted from an even-numbered row in the row direction X by half of the pitch between the pixels in each pixel row which are arranged in the row direction X.

The plurality of pixels include first pixels (pixels 20R, 20G, and 20B) which detect one of a pair of light beams that pass through different pupil regions of the imaging optical system 1 and second pixels (pixels 21R, 21G, and 21B) which detect the other of the pair of light beams. The imaging device 100b is not provided with a pixel which can detect both the pair of light beams that pass through different pupil regions of the imaging optical system 1.

In the example shown in FIG. 4, each pixel 20R, 20G, or 20B is configured such that a light receiving region (a white triangular portion (having a letter R, G, or B therein) in FIG. 4) which receives light and converts the light into an electric signal deviates from the center of the pixel to the right direction. A region (hatched region) other than the light receiving region in each pixel 20R, 20G, or 20B is shielded by a light shielding film.

Each pixel 21R, 21G, or 21B is configured such that a light receiving region (a white triangular portion (having a letter R, G, or B therein) in FIG. 4) which receives light and converts the light into an electric signal deviates from the center of the pixel to the left direction. A region (hatched region) other than the light receiving region in each pixel 21R, 21G, or 21B is shielded by the light shielding film.

The pixels 20R, 20G, and 20B and the pixels 21R, 21G, and 21B can have a known structure so as to be the same as the pixels 10 and the pixels 11 shown in FIG. 2, respectively.

In each of the pixels 20R and 21R, a color filter which transmits red (R) light is provided on the light receiving region. In each of the pixels 20G and 21G, a color filter which transmits green (G) light is provided on the light receiving region. In each of the pixels 20B and 21B, a color filter which transmits blue (B) light is provided on the light receiving region.

In FIG. 4, the colors of the color filters included in each pixel are represented by letters "R", "G", and "B" in the triangles indicating the light receiving regions of each pixel. In the example shown in FIG. 4, among a plurality of pixels included in the imaging device 100b, the arrangement of the color filters provided on the pixels in the odd-numbered rows is the Bayer array and the arrangement of the color filters provided on the pixels in the even-numbered rows is also the Bayer array.

In the imaging device 100b, when the arrangement of the pixels is viewed from a direction F which is inclined at an angle of 45° with respect to the row direction X, columns of the first pixels (pixels in which the light receiving region deviates to the right side of the row direction X) and columns of the second pixels (pixels in which the light receiving region deviates to the left side of the row direction X) are alternately arranged in a direction G perpendicular to the direction F. Each pixel in the column of the first pixels and the second pixel which is adjacent to the pixel in a predetermined direction (right direction) of the direction G detect the same color.

In the imaging device 100b having the above-mentioned structure, when each pixel 20R, 20G, or 20B is the pixel of interest, two or more second pixels (pixels 21R, 21G, and 21B) which are a different type from the pixel of interest are not arranged so as to be adjacent to the pixel of interest in the deviation direction of the light receiving region in the pixel of interest (on the right side of the pixel of interest). For example, in the imaging device 100b shown in FIG. 4, an imaging device in which pixels in the even-numbered row are the first pixels and pixels in the odd-numbered row are the second pixels are shown as a reference in FIGS. 5 and 6.

Figure 5:
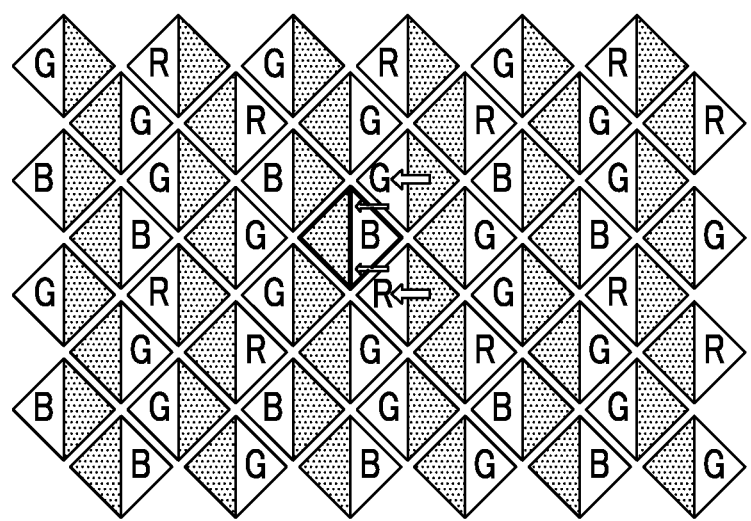
FIG. 5 is a diagram illustrating a reference example of the arrangement of pixels in the imaging device.
Figure 6:
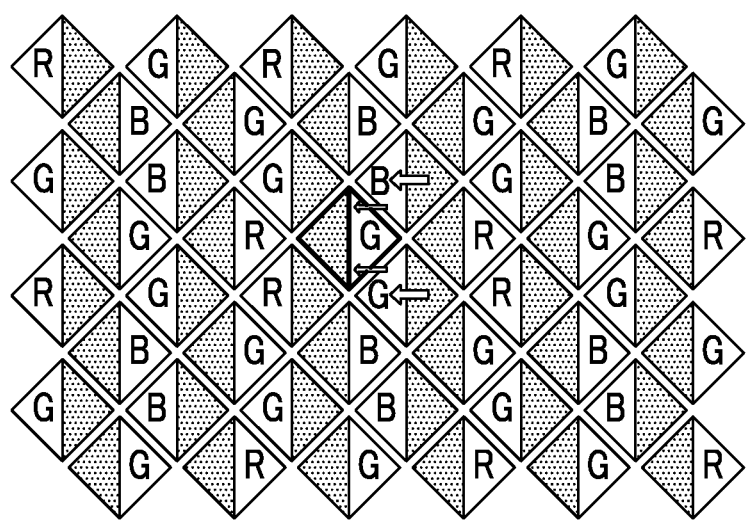
FIG. 6 is a diagram illustrating a reference example of the arrangement of pixels in the imaging device.

In FIGS. 5 and 6, two second pixels are adjacent to the right side of the first pixel surrounded by a thick line. In this structure, light that leaks from two second pixels, which are adjacent to the right side of the first pixel surrounded by a thick line in FIGS. 5 and 6, is incident on the light receiving region of the first pixel. Therefore, the reliability of a signal obtained from the first pixel is reduced.

The pixel 21B and the pixel 20G are arranged adjacent to the right side of the pixel 20B surrounded by the thick line in FIG. 4. Therefore, only light that leaks from the pixel 21B, which is adjacent to the right side of the pixel 20B surrounded by the thick line in FIG. 4, is incident on the light receiving region of the pixel 20B. In FIG. 4, the signal from the pixel 20B surrounded by the thick line is offset a little by the leakage light. However, the leakage light is about half of the amount of light which leaks from the pixel 21B and the amount of light which is offset is less than that in the structure shown in FIGS. 5 and 6. The color of the leakage light is the same as that of light which is detected by the pixel 20B surrounded by the thick line in FIG. 4. Therefore, the influence of the leakage light is less than that when the color of the leakage light is different from the color of the light which is detected by the pixel 20B surrounded by the thick line in FIG. 4. According to the imaging device 100b shown in FIG. 4, it is possible to prevent a reduction in the reliability of the signal obtained from the first pixel.

In the imaging device 100b, when each pixel 21R, 21G, or 21B is the pixel of interest, two or more first pixels (pixels 20R, 20G, and 20B) which are a different type from the pixel of interest are not arranged so as to be adjacent to the pixel of interest in the deviation direction of the light receiving region in the pixel of interest (on the left side of the pixel of interest). Therefore, it is possible to prevent a reduction in the reliability of the signal obtained from the second pixel, similarly to each pixel 20R, 20G, or 20B.

Since FIG. 4 is a plan view schematically illustrating the imaging device, the distance between two pixels in which light receiving regions face each other in the row direction X is small. However, in practice, the distance is more than that in FIG. 4. Therefore, the influence of crosstalk between two pixels is negligible.

In the imaging device 100b, when each pixel to which four pixels are adjacent is the pixel of interest, the layout of the first pixels and the second pixels may be determined such that the following conditions are satisfied: among the four pixels adjacent to the pixel of interest, the pixels which are close to the pixel of interest in the deviation direction of the light receiving region in the pixel of interest include at least a pixel which is the same type as the pixel of interest. In this case, it is possible to obtain the above-mentioned effect.

In the imaging device 100b, the layout of pixels to which four pixels are not adjacent (pixels arranged at the edge in FIG. 4) may be appropriately determined such that the conditions of each pixel to which four pixels are adjacent are not broken.

For example, for each pixel 20G in the first row in FIG. 4, the pixel 21G which forms a pair together with the pixel 20G is not arranged in the vicinity of the pixel 20G and the light shielding regions of other pixels are adjacent to the left and right sides of the pixel 20G Therefore, the pixel 20G may be replaced with the pixel 21G. In addition, for each pixel 21G in the last row in FIG. 4, the pixel 21G which forms a pair together with the pixel 20G is not arranged in the vicinity of the pixel 21 G and the light shielding regions of other pixels are adjacent to the left and right sides of the pixel 21G. Therefore, the pixel 21G may be replaced with the pixel 20G FIG. 7 is a schematic plan view illustrating an imaging device 100c which is a modification example of the imaging device 100 provided in the digital camera shown in FIG. 1.

The imaging device 100c has the same structure as the imaging device 100b except that the arrangement of color filters in each pixel is different from the arrangement of the first and second pixels.

In the imaging device 100c, when the arrangement of the pixels is viewed from the direction F which is inclined at an angle of 45° with respect to the row direction X, two columns of the first pixels and two columns of the second pixels are alternately arranged in the direction G perpendicular to the direction F. Each pixel in the column of the first pixels and the second pixel which is adjacent to the pixel in a predetermined direction (right direction) of the direction G detect the same color. Each pixel in the column of the first pixels and the second pixel which is adjacent to the pixel in a direction (left direction) opposite to the predetermined direction of the direction G detect the same color.

Figure 7:
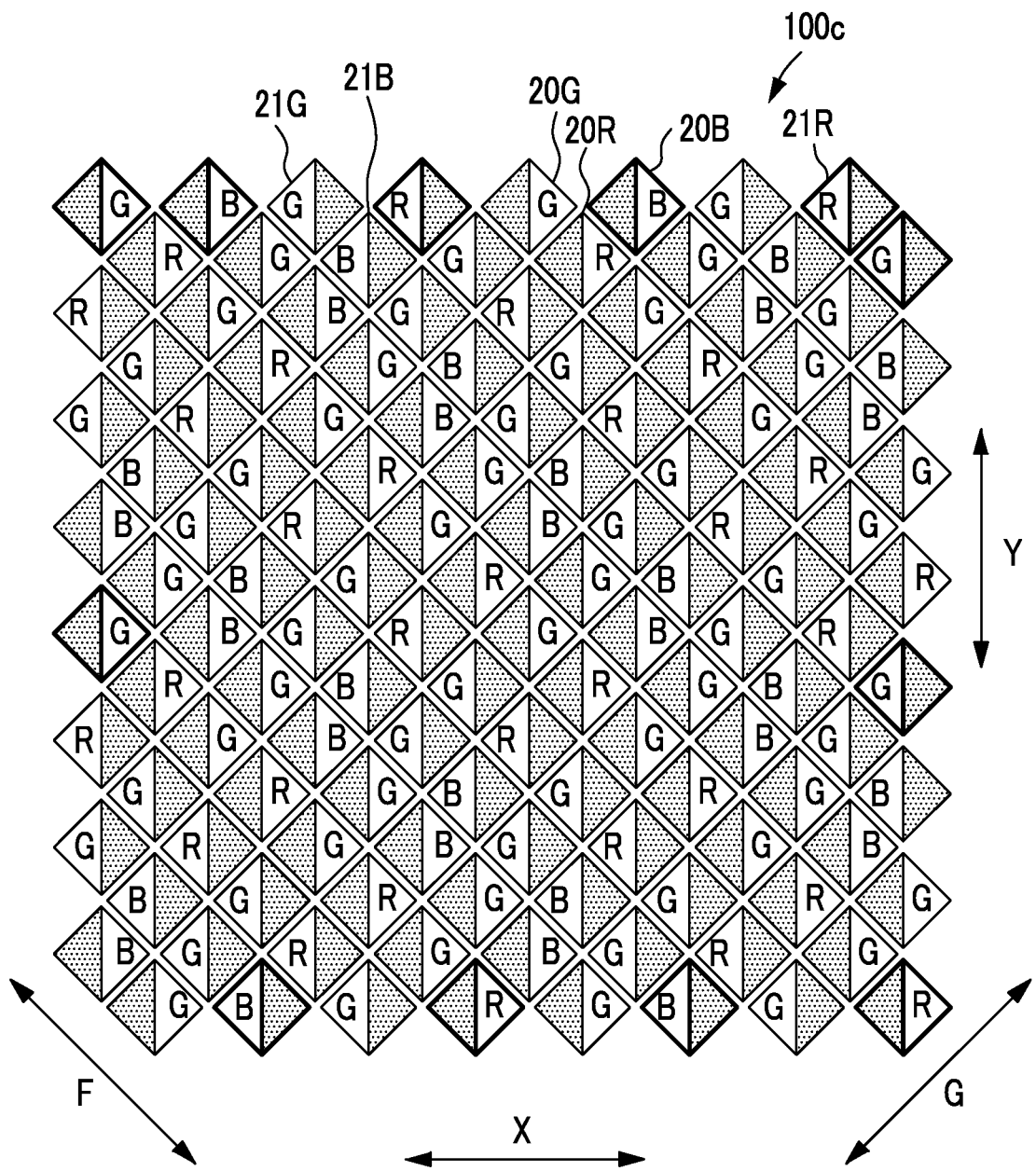
FIG. 7 is a schematic plan view illustrating an imaging device 100c which is a modification example of the imaging device 100 provided in the digital camera shown in FIG. 1.

In the structure shown in FIG. 7, when each pixel to which four pixels are adjacent is the pixel of interest, the following conditions are satisfied: among the four pixels adjacent to the pixel of interest, the pixels which are close to the pixel of interest in the deviation direction of the light receiving region in the pixel of interest include at least a pixel which is the same type as the pixel of interest. That is, in the imaging device 100c, for each pixel, two or more pixels which are a different type from the pixel are not arranged so as to be adjacent to the pixel in the deviation direction of the light receiving region in the pixel. Therefore, according to the imaging device 100c, it is possible to prevent a reduction in the reliability of signals obtained from the first pixel and the second pixel, similarly to the imaging device 100b.

In FIG. 7, the pixel surrounded by a thick frame may be replaced with a different type of pixel. However, when pixels 20B and 20R in the first row and pixels 21B and 21R in the last row are replaced with opposite types of pixels, leakage light is incident on pixels which are adjacent to these pixels. Therefore, it is preferable to maintain the structure shown in FIG. 7. When the replacement is performed, the amount of leakage light incident on pixels adjacent to these pixels is less than that in the structure shown in FIGS. 5 and 6. Therefore, it is possible to obtain the effect.

In FIG. 7, the pixel 20R may be replaced with the pixel 20B, the pixel 20B may be replaced with the pixel 20R, the pixel 21R may be replaced with the pixel 21B, and the pixel 21B may be replaced with the pixel 21R.

Figure 8:
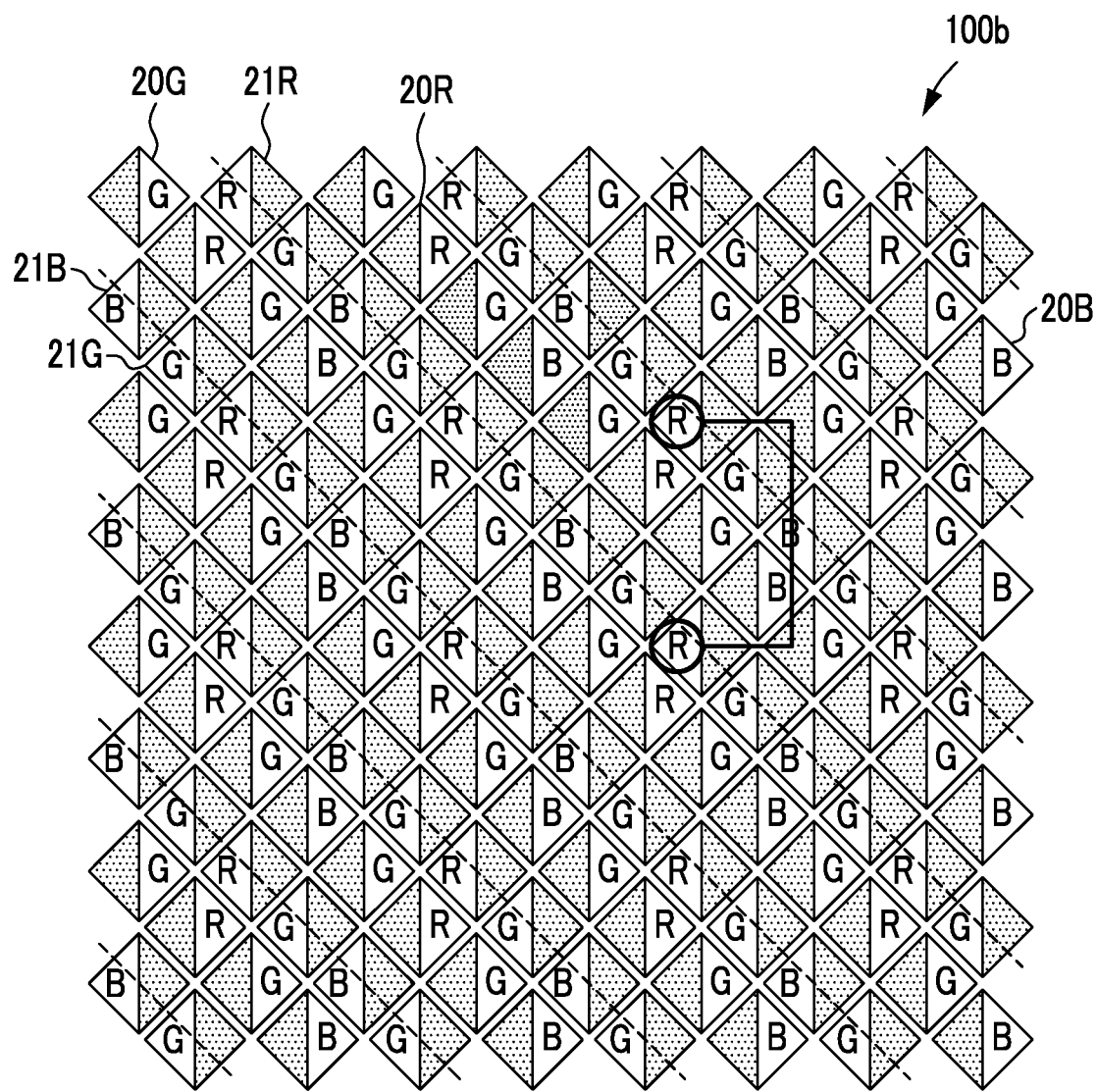
FIG. 8 is a diagram illustrating a method of reading a signal from the imaging device 100b shown in FIG. 4.

When the digital camera is provided with the imaging device 100b, the imaging device driving unit 10 of the digital camera shown in FIG. 1 independently performs an operation of reading a captured image signal obtained from the pixels which are connected to each other by a dashed line in FIG. 8 and an operation of reading a captured image signal obtained from the other pixels, as shown in FIG. 8. As such, when two captured image signals are separately read, it is easy to perform the subsequent signal processing. In the imaging device 100b, for example, signals obtained from the pixels which are surrounded by a black circle in FIG. 8 can be added to add the pixels.

Figure 9:
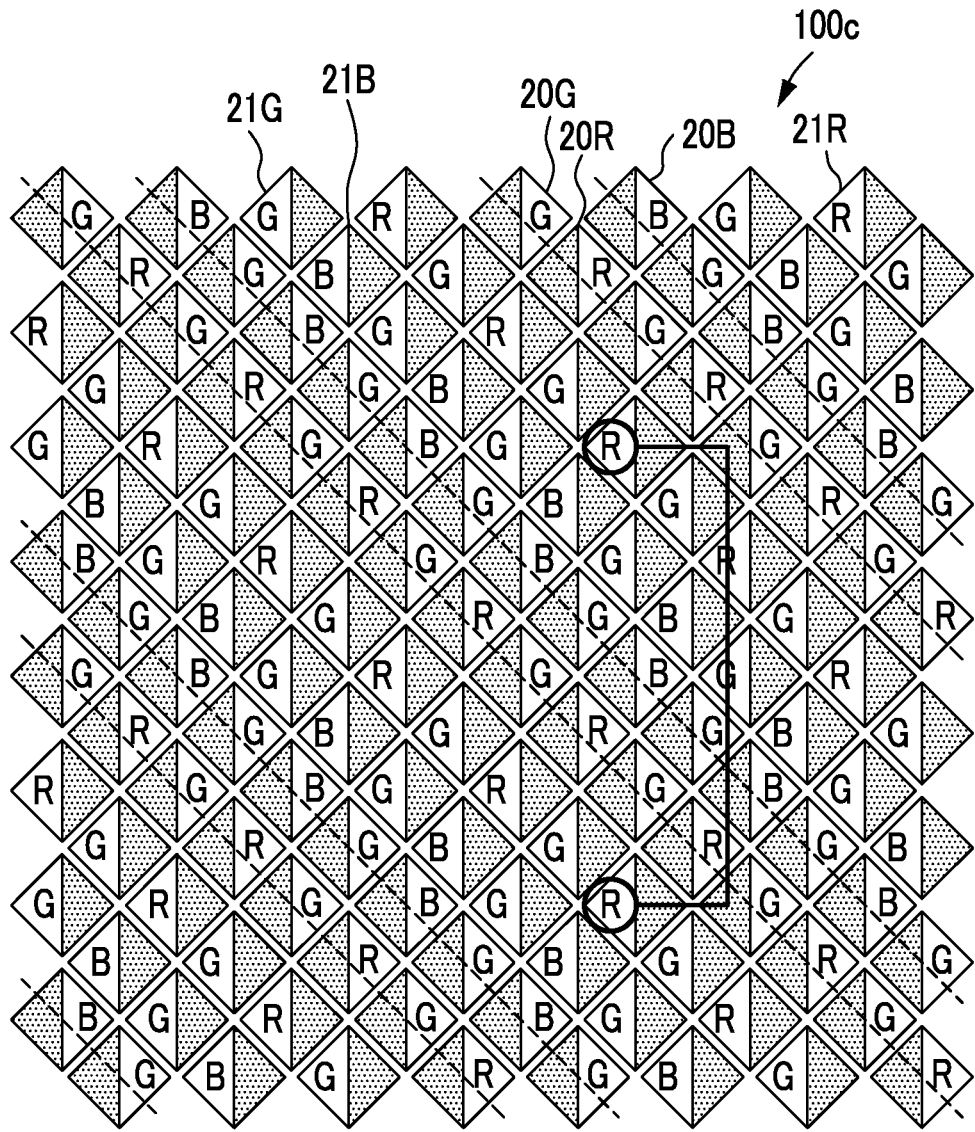
FIG. 9 is a diagram illustrating a method of reading a signal from the imaging device 100c shown in FIG. 7.

When the digital camera is provided with the imaging device 100c, the imaging device driving unit 10 independently performs an operation of reading a captured image signal obtained from the pixels which are connected to each other by a dashed line in FIG. 9 and an operation of reading a captured image signal obtained from the other pixels, as shown in FIG. 9. As such, when two captured image signals are separately read, it is easy to perform the subsequent signal processing. In the imaging device 100c, for example, signals obtained from the pixels which are surrounded by a black circle in FIG. 9 can be added to add the pixels.

Figure 10:
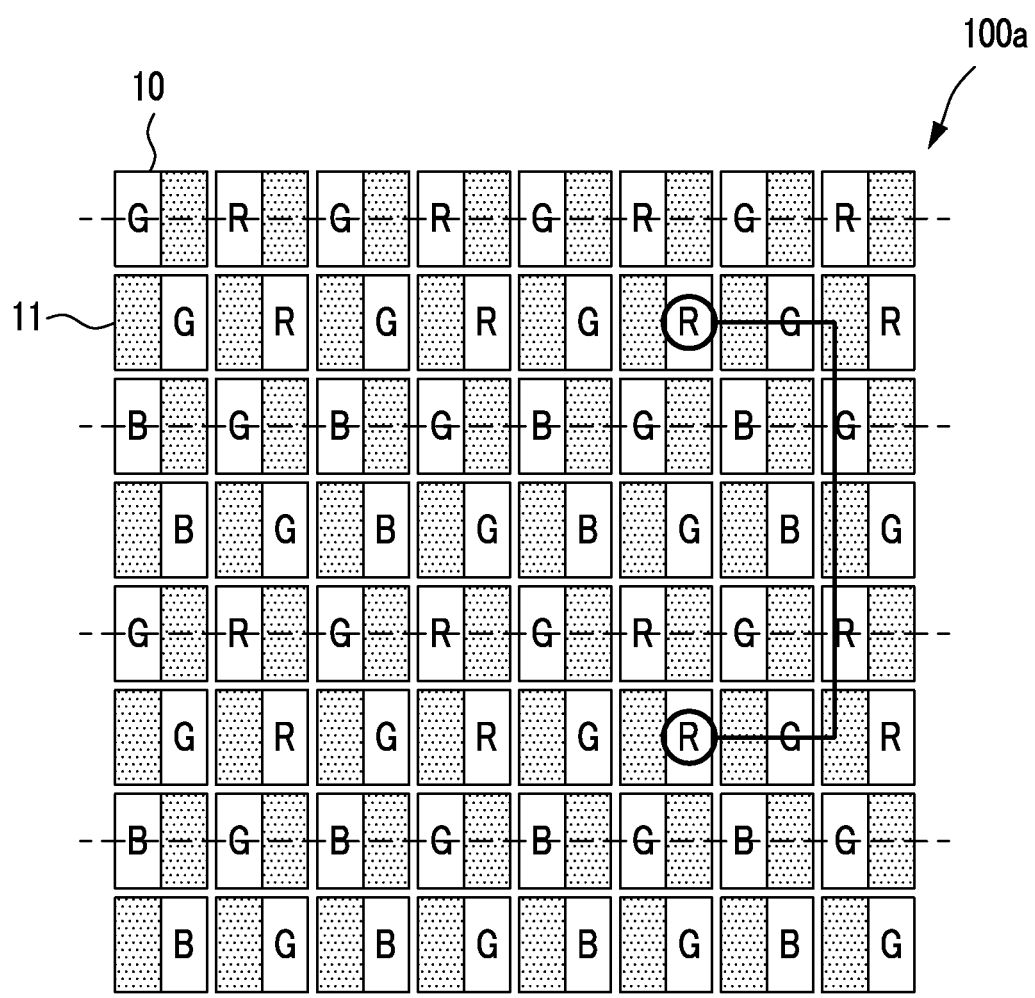
FIG. 10 is a diagram illustrating a method of reading a signal from the imaging device 100a shown in FIG. 3.
Figure 11:
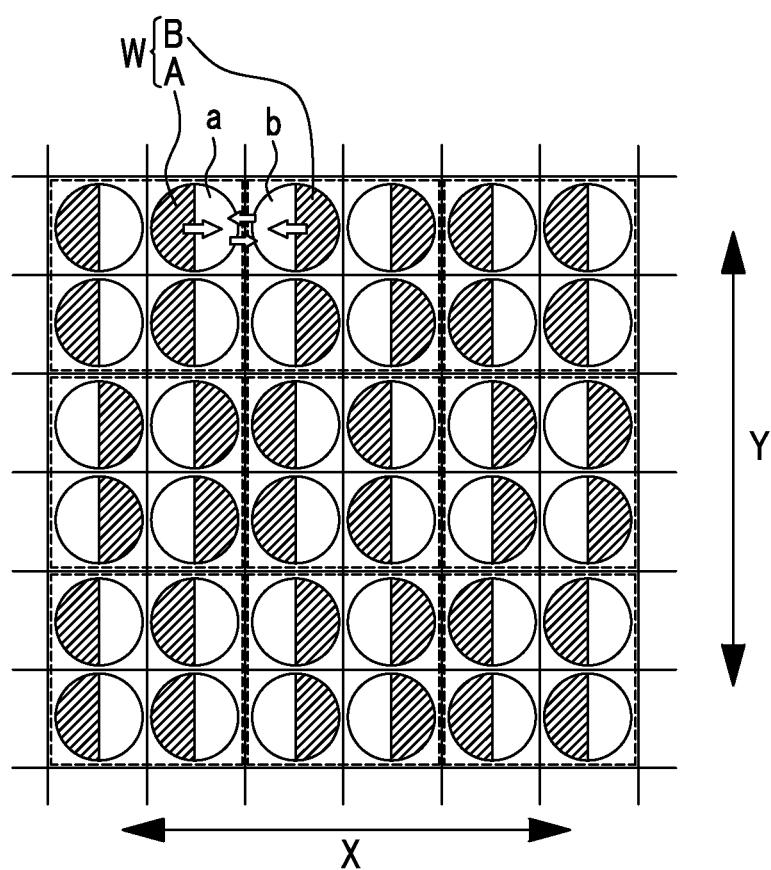
FIG. 11 is a schematic plan view illustrating an imaging device according to the related art.

When the digital camera is provided with the imaging device 100a, the imaging device driving unit 10 independently performs an operation of reading a captured image signal obtained from the pixels which are connected to each other by a dashed line in FIG. 10 and an operation of reading a captured image signal obtained from the other pixels, as shown in FIG. 10. In the imaging device 100a, for example, signals obtained from the pixels which are surrounded by a black circle in FIG. 10 can be added to add the pixels.

As can be seen from the comparison between FIGS. 9 and 8 and FIG. 10, according to the imaging devices 100a and 100b, the distance between two signals for pixel addition in the column direction Y can be less than that in the imaging device 100c. Therefore, the imaging devices 100a and 100b are advantageous when pixel addition is performed. In the imaging device 100c, a pair of pixels having the light receiving regions close to each other and a pair of pixels having the light receiving regions separated from each other are mixed as a pair of the first pixel and the second pixel which are adjacent to each other and detect light of the same color. The pair of pixels having the light receiving regions separated from each other is less affected by crosstalk than the pair of pixels having the light receiving regions close to each other. Therefore, the imaging device 100c can improve the reliability of the captured image signal obtained from each of the first pixel and the second pixel, as compared to the imaging device 100b including only the pair of pixels having the light receiving regions close to each other.

In both the imaging device 100b and the imaging device 100c, the color filter may not be provided on each pixel. Even when the color filter is not provided, it is possible to obtain the effect of reducing crosstalk.

As described above, the following points are disclosed in the specification.

A disclosed imaging device includes a plurality of pixels including two types of pixels, such as a first pixel that receives one of a pair of light beams which pass through different pupil regions of an imaging optical system and a second pixel that receives the other of the pair of light beams. The plurality of pixels are two-dimensionally arranged. A light receiving region of the first pixel deviates from the center of the first pixel in one direction. A light receiving region of the second pixel deviates from the center of the second pixel in a direction opposite to the one direction. When each pixel to which three or four pixels are adjacent is a pixel of interest, among the three or four pixels adjacent to the pixel of interest, pixels which are close to the pixel of interest in a deviation direction of the light receiving region in the pixel of interest include at least a pixel which is the same type as the pixel of interest.

In the disclosed imaging device, the plurality of pixels are arranged in a square lattice shape (here, the lattice shape means a checker flag shape). The first pixel is arranged in an odd-numbered row in the square-lattice-shaped arrangement and the second pixel is arranged in an even-numbered row in the square-lattice-shaped arrangement.

In the disclosed imaging device, a pair of the first pixel and the second pixel which are adjacent to each other in a column direction detects light of the same color. The square-lattice-shaped arrangement includes pairs of a plurality of colors including a pair which detects light of a first color, a pair which detects light of a second color different from the first color, and a pair which detects light of a third color different from the first color and the second color. Three types of pairs are arranged in a Bayer array. Specifically, the pair which detects light of the first color is a pair which detects red light, the pair which detects light of the second color is a pair which detects green light, and the pair which detects light of the third color is a pair which detects blue light. In addition, a color other than the three types of pairs may be a complementary color or white.

In the disclosed imaging device, the plurality of pixels are arranged such that a plurality of pixel rows, each having a plurality of pixels arranged in a row direction, are arranged in a column direction perpendicular to the row direction and an odd-numbered pixel row among the plurality of pixel rows is shifted from an even-numbered pixel row in the row direction by half of a pitch between the pixels in each pixel row arranged in the row direction.

In the disclosed imaging device, when the arrangement of the plurality of pixels is viewed from a direction which is inclined at an angle of 45° with respect to the row direction, columns of the first pixels and columns of the second pixels are alternately arranged in a direction perpendicular to the 45-degree direction.

In the disclosed imaging device, the first pixels and the second pixels each include three types of pixels, such as a pixel which detects red light, a pixel which detects green light, and a pixel which detects blue light. Each pixel in a column of the first pixels and the second pixel which is adjacent to the pixel in a predetermined direction of the direction perpendicular to the 45-degree direction detect the same color. In addition, a pixel which detects light of a complementary color or a pixel which detects white light may be used other than the three types of pixels.

In the disclosed imaging device, when the arrangement of the plurality of pixels is viewed from the direction which is inclined at an angle of 45° with respect to the row direction, two columns of the first pixels and two columns of the second pixels are alternately arranged in the direction perpendicular to the 45-degree direction.

In the disclosed imaging device, the first pixels and the second pixels each include three types of pixels, such as a pixel which detects red light, a pixel which detects green light, and a pixel which detects blue light. Each pixel in the column of the first pixels and the second pixel which is adjacent to the pixel in a predetermined direction of the direction perpendicular to the 45-degree direction detect the same color. Each pixel in the column of the first pixels and the second pixel which is adjacent to the pixel in a direction opposite to the predetermined direction of the direction perpendicular to the 45-degree direction detect the same color. In addition, a pixel which detects light of a complementary color or a pixel which detects white light may be used other than the three types of pixels.

A disclosed imaging apparatus includes an imaging device, a single imaging optical system, and a three-dimensional image data generation unit that generates three-dimensional image data, using image data based on a captured image signal which is output from a first pixel of the imaging device and image data based on a captured image signal which is output from a second pixel of the imaging device.

What is claimed is:
1. An imaging device comprising:
a plurality of pixels including a first pixel that detects one of a pair of light beams which pass through different pupil regions of a single imaging optical system and a second pixel that detects the other of the pair of light beams, the plurality of pixels being two-dimensionally arranged,
wherein a light receiving region of the first pixel is positioned at a first side of a center of the first pixel in a first direction,
a light receiving region of the second pixel is positioned at another side of a center of the second pixel in a second direction that is opposite to the first direction,
in the plurality of pixels, each pixel to which four pixels are adjacent is a pixel of interest,
among the four pixels adjacent to the pixel of interest, pixels which are provided in the first direction of the light receiving region of the pixel of interest include a pixel which has a light receiving region that is positioned in a same direction as the light receiving region of the pixel of interest, and
the plurality of pixels are arranged such that a plurality of pixel rows, each having a plurality of pixels arranged in a row direction, are arranged in a column direction perpendicular to the row direction and an odd-numbered pixel row among the plurality of pixel rows is shifted from an even-numbered pixel row in the row direction by half of a pitch between the pixels in each pixel arranged in the row direction,
wherein, when the arrangement of the plurality of pixels is viewed from a direction which is inclined at an angle of 45° with respect to the row direction, columns of the first pixels and columns of the second pixels are alternately arranged in a direction perpendicular to the 45-degree direction,
wherein the first pixels and the second pixels each include pixels of a plurality of colors including a pixel which detects light of a first color a pixel which detects light of a second color different from the first color, and a pixel which detects light of a third color different from the first color and the second color, and
each pixel in a column of the first pixels and the second pixel which is adjacent to the pixel in a predetermined direction of the direction perpendicular to the 45-degree direction detect the same color.

* * * * *